United States Patent
Chang

(10) Patent No.: US 10,043,695 B1
(45) Date of Patent: Aug. 7, 2018

(54) APPARATUS FOR CARRYING AND SHIELDING WAFERS

(71) Applicant: HIMAX TECHNOLOGIES LIMITED, Tainan (TW)

(72) Inventor: Jui Tang Chang, Tainan (TW)

(73) Assignee: Himax Technologies Limited, Tainan (TW)

( * ) Notice: Subject to any disclaimer, the term of this patent is extended or adjusted under 35 U.S.C. 154(b) by 6 days.

(21) Appl. No.: 15/455,955

(22) Filed: Mar. 10, 2017

(51) Int. Cl.
*B65D 85/00* (2006.01)
*H01L 21/673* (2006.01)

(52) U.S. Cl.
CPC .. *H01L 21/67373* (2013.01); *H01L 21/67389* (2013.01)

(58) Field of Classification Search
CPC ......... H01L 21/67373; H01L 21/67389; H01L 21/67369; H01L 21/67386; H01L 21/67383; H01L 21/67346; B65D 1/36; H05K 13/0084; B05B 13/0285; C23C 14/505
USPC ....... 206/701, 710, 711, 712, 722, 723, 725, 206/449, 832, 825; 118/500; 414/217.1
See application file for complete search history.

(56) References Cited

U.S. PATENT DOCUMENTS

| | | | | |
|---|---|---|---|---|
| 4,609,103 A | * | 9/1986 | Bimer | H01L 21/67373 206/454 |
| 9,184,077 B2 | * | 11/2015 | Yang | H01L 21/67369 |
| 2007/0175792 A1 | * | 8/2007 | Gregerson | H01L 21/67126 206/711 |
| 2013/0174640 A1 | * | 7/2013 | Oh | H01L 21/67389 73/23.2 |
| 2015/0008154 A1 | * | 1/2015 | Brooks | H01L 21/67369 206/711 |

FOREIGN PATENT DOCUMENTS

| | | |
|---|---|---|
| JP | 2908161 B2 | 6/1999 |
| JP | 5961919 B2 | 8/2016 |
| WO | WO2014/189739 A1 | 11/2014 |

OTHER PUBLICATIONS

Extended European Search Report dated Sep. 28, 2017 in related European Application No. 17162160.0.

\* cited by examiner

*Primary Examiner* — Jacob K Ackun
*Assistant Examiner* — Jenine Pagan
(74) *Attorney, Agent, or Firm* — Donald E. Stout; Stout, Uxa & Buyan, LLP

(57) ABSTRACT

Apparatus for carrying and shielding wafers includes a wafer container, a plurality of wafer cassettes disposed in the wafer container, and an engaging lock that prevents the wafer cassettes from shifting, the engaging lock being in direct contact with walls of the wafer cassettes.

7 Claims, 5 Drawing Sheets

APPARATUS FOR CARRYING AND SHIELDING WAFERS

BACKGROUND OF THE INVENTION

1. Field of the Invention

The present invention generally relates to wafer cassettes, and more particularly to apparatus for carrying and shielding wafers.

2. Description of Related Art

A wafer cassette is a device that is capable of holding wafers to allow the wafers to be transferred between machines for processing or measurement. The wafers stored in the wafer cassette may be taken out of or be placed into the wafer cassette by a robotic hand or fork.

The purpose of Standard Mechanical InterFace (SMIF) pods is to isolate wafers from contamination by providing a miniature environment with controlled airflow, pressure and particle count. SMIF pods can be accessed by a robotic arm of a robot system. Front Opening Unified Pod (FOUP) is another enclosure standard designed to hold wafers securely and safely in a controlled environment, and to allow the wafers to be transferred between machines for processing or measurement.

For efficiency, more than one wafer cassettes are usually disposed in conventional pods or enclosures. Nevertheless, as the wafer cassettes are individually placed in the pod or enclosure, the conventional pod or enclosure suffers from low operational precision when the wafers are accessed by the robotic arm of the robot system.

In order to prevent the wafer cassettes and the wafers stored therein from shifting while the pod or enclosure is moving, a mechanism need be provided to firmly hold the wafer cassettes. Conventional mechanism, however, may sometimes damage the wafers due to large manufacturing tolerance of the mechanism.

While accessing wafers from or into a conventional wafer cassette, the front end of a robotic hand usually bounces as the front end of the robotic hand unexpectedly hits the wall of the wafer cassette due to misalignment.

For the reasons, a need has thus arisen to propose a novel apparatus for carrying and shielding wafers to overcome disadvantages of the conventional pods or enclosures.

SUMMARY OF THE INVENTION

In view of the foregoing, it is an object of the embodiment of the present invention to provide apparatus for carrying and shielding wafers with high operational precision, without damaging wafers or bouncing the wall of the wafer cassette.

According to one embodiment, apparatus for carrying and shielding wafers includes a wafer container, a plurality of wafer cassettes and an engaging lock. The wafer cassettes are disposed in the wafer container. The engaging lock prevents the wafer cassettes from shifting, and the engaging lock is in direct contact with walls of the wafer cassettes.

According to another embodiment, apparatus for carrying and shielding wafers includes a wafer container and a plurality of wafer cassettes. The wafer cassettes are disposed in the wafer container, and are disposed on all sides of the container.

DETAILED DESCRIPTION OF THE INVENTION

Figure 1:
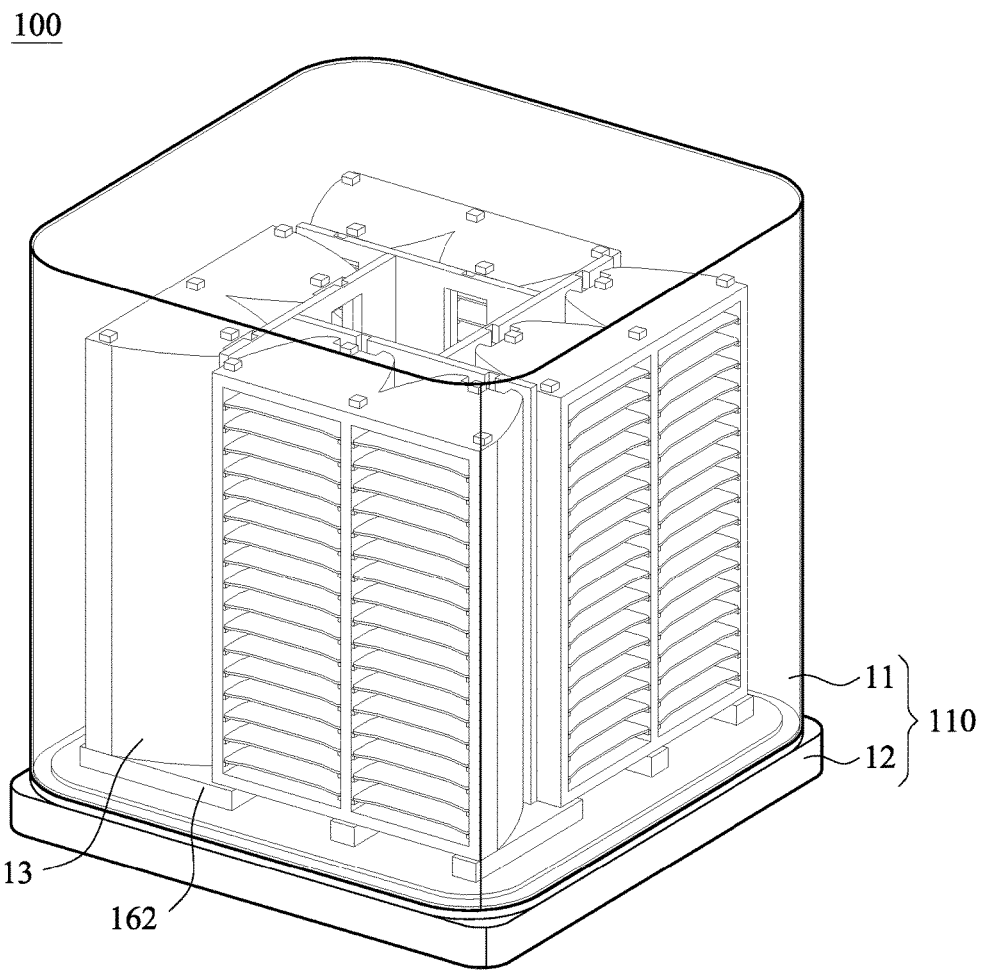
FIG. 1 shows a perspective view of apparatus for carrying and shielding wafers according to one embodiment of the present invention.

FIG. 1 shows a perspective view of apparatus 100 for carrying and shielding wafers, such as optical components (e.g., optical lenses or glasses), according to one embodiment of the present invention. In the embodiment, the apparatus 100 may include a wafer container 110, which primarily includes a cover 11 and a base 12. The cover 11 and the base 12 define a space for accommodating wafers. The cover 11 is preferably made of a transparent material (e.g., plastic) such that the wafers stored in the wafer container 110 may be readily inspected. One purpose of the wafer container 110 is to isolate the wafers from contamination by providing a mini environment. The wafer container 110 is designed to hold wafers securely and safely in a controlled environment, and to allow the wafers to be transferred between machines for processing or measurement.

In one embodiment, the wafer container 110 complies with Standard Mechanical InterFace (SMIF) standard. In another embodiment, the wafer container 110 complies with Front Opening Unified Pod (FOUP) standard. It is noted that the wafer container 110 of the embodiment may adopt standards other than SMIF and FOUP.

The apparatus 100 of the embodiment may include a plurality of wafer cassettes 13 disposed on the base 12 and enclosed in the cover 11. According one aspect of the embodiment, wafer cassettes 13 are disposed on all sides (four in this case) of the container 110. In the embodiment, at least two columns of wafer cassettes 13 are disposed on each side of the wafer container 110. The at least two columns of wafer cassettes 13 on the same side stand side by side, and have their openings facing outward. Accordingly, when the wafers on one side have been accessed by a robotic arm of a robot system, the base 12 is rotated and the wafers on other side may then be accessed by the robotic arm. In one embodiment, the at least two columns of wafer cassettes 13 on the same side are integrally formed as a single piece. According to another aspect of the embodiment, all columns of wafer cassettes 13 may be integrated as a single unit that can be wholly transferred into or from the wafer container 110. For example, top ends and bottom ends of all columns of wafer cassettes 13 may be pivotally connected to a top plate 161 and a bottom plate 162, respectively, thereby fixing all column of wafer cassettes 13 together. Moreover, the integrated wafer cassettes 13 have the benefit of higher operational precision than the wafer cassettes that are isolated from each other, or are individually disposed.

Figure 2A:
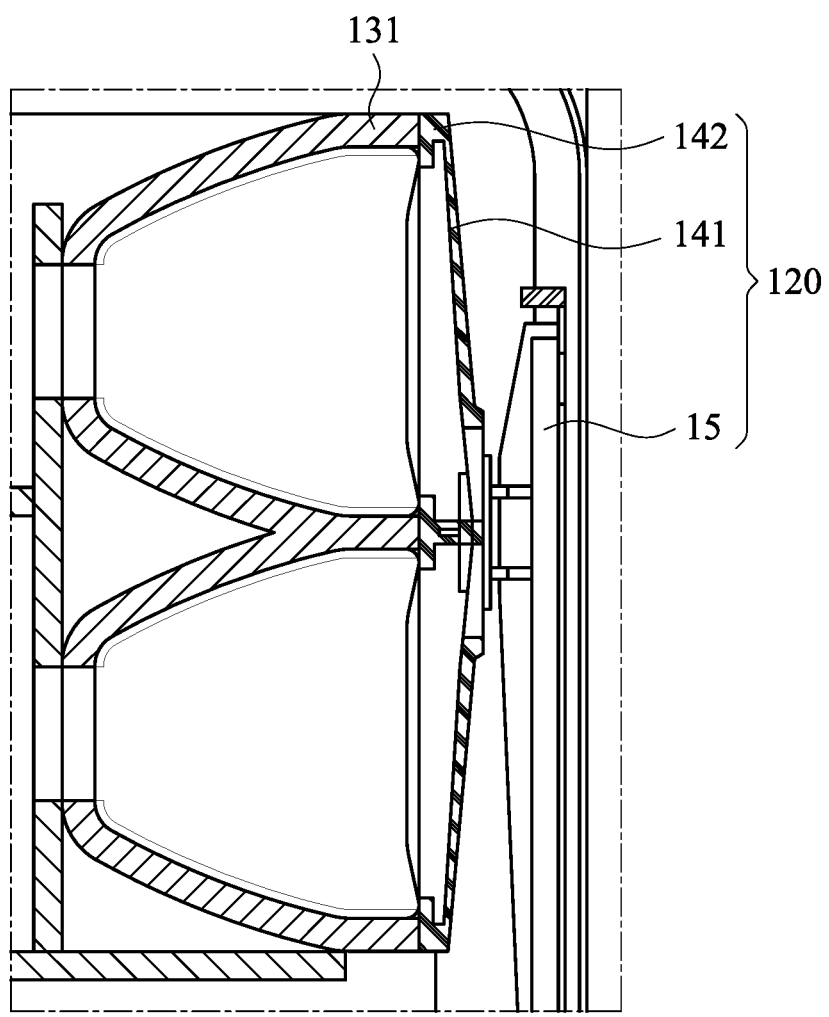
FIG. 2A shows a top view of an engaging lock of the apparatus of FIG. 1 according to one embodiment of the present invention.
Figure 2B:
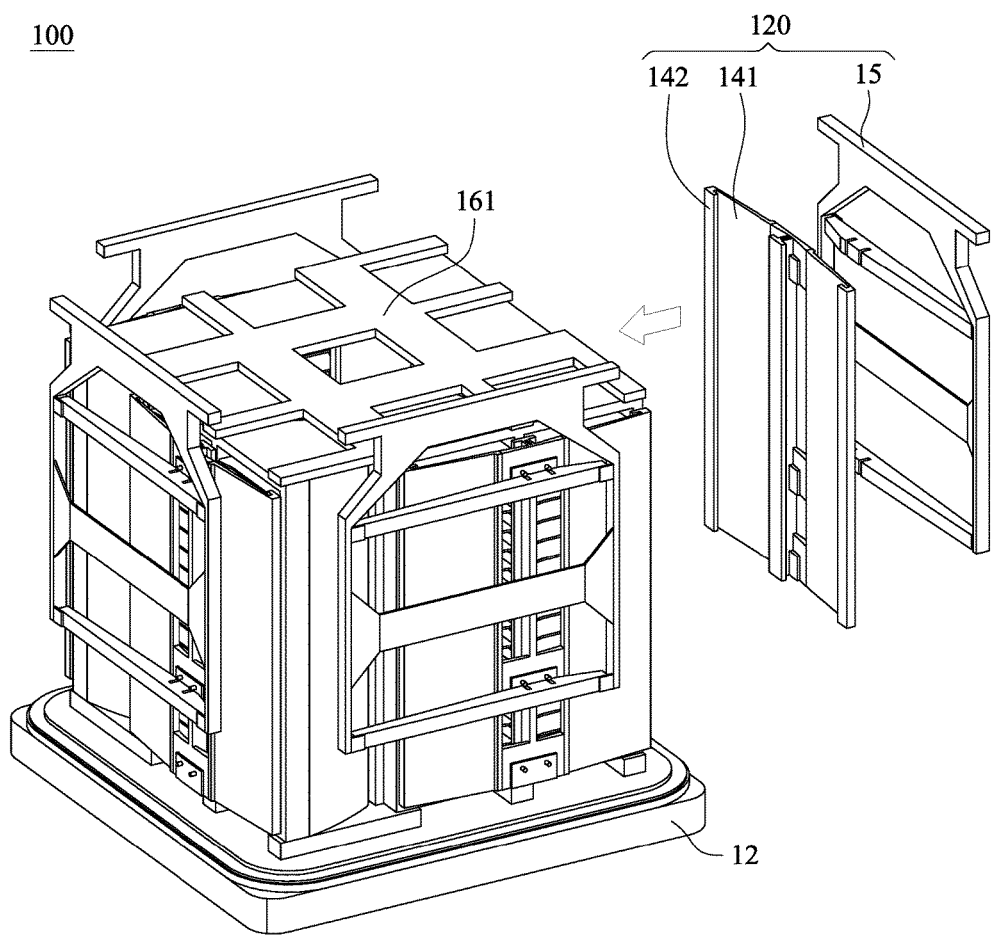
FIG. 2B shows a perspective view of the engaging lock of FIG. 2A.

FIG. 2A shows a top view of an engaging lock 120 of the apparatus 100 of FIG. 1 adaptable for preventing the wafer cassettes 13 from shifting while the wafer container 110 with the wafer cassettes 13 is moving according to one embodiment of the present invention. FIG. 2B shows a perspective view of the engaging lock 120 of FIG. 2A. In the embodiment, the engaging lock 120 may include a dome 141 with elongated strips 142 fixedly disposed in vertical direction on an inner surface of the dome 141. In one embodiment, the dome 141 and the elongated strips 142 may be integrally formed as a single piece. In another embodiment, the dome 141 and the elongated strips 142 may be integrated into a single unit.

According to another aspect of the embodiment, the elongated strips 142 are designed to be in direct contact with walls 131, but not the wafers, of the wafer cassettes 13. In one embodiment, the length in a crosswise direction of the dome 141 may be designed to adjust the elongated strips 142 to be in direct contact with walls 131 of the wafer cassettes 13.

The engaging lock 120 of the embodiment may also include a bracket 15. The bracket 15 has an inner surface fixed on an outer surface of the dome 141, and has an outer surface fixed on an inner surface of the cover 11. Accordingly, when the cover 11 is placed over the wafer cassettes 13, the engaging lock 120 exerts pressure on the walls 131 of the wafer cassettes 13 to firmly hold the wafer cassettes 13 such that no movement between the wafer cassettes 13 and the cover 11 can occur, thereby securely preventing the wafer cassettes 13 from shifting while the wafer container 110 is moving. The benefit of designing the elongated strips 142 of the embodiment to be in direct contact with walls 131, but not the wafers, of the wafer cassettes 13 is that the wafers will not be damaged by the elongated strips 142 in case the manufacturing tolerance of the elongated strips 142 is large. In one embodiment, as shown in FIG. 2A, each elongated strip 142 has one-side or two-side horizontal extensions in a crosswise direction of the wafer cassettes 13, and the extensions are configured to prevent the wafers from slipping away from the wafer cassettes 13. In the embodiment, the dome 141, the elongated strips 142 and the bracket 15 may be made of a metallic material.

Figure 3A:
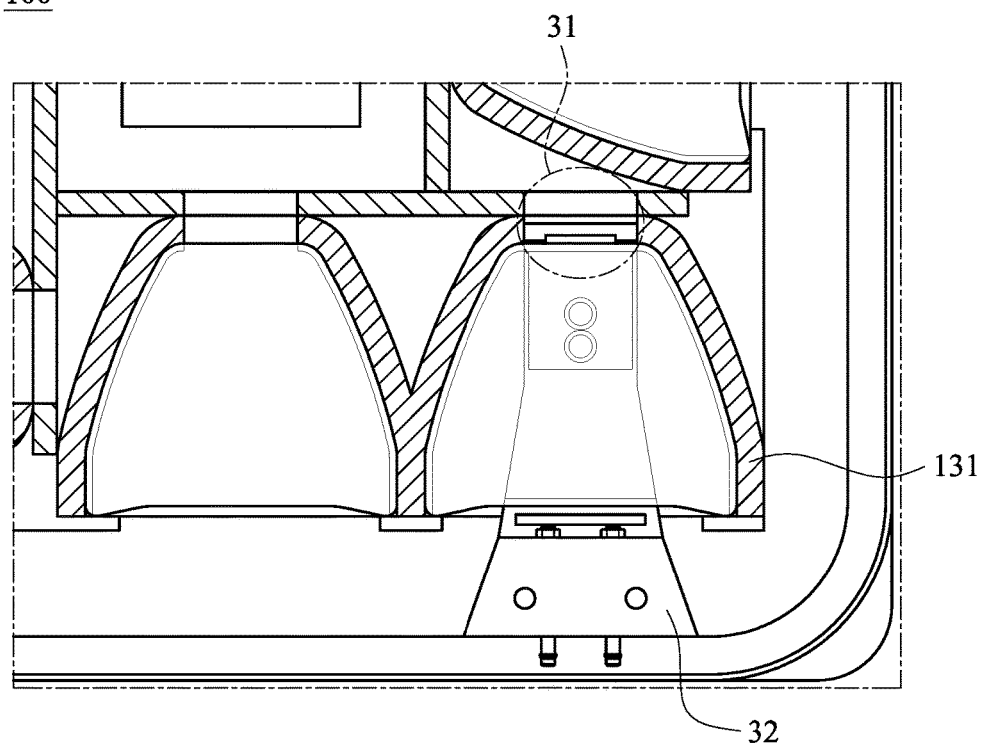
FIG. 3A shows a top view illustrating a portion of the apparatus of FIG. 1 according to one embodiment of the present invention.
Figure 3B:
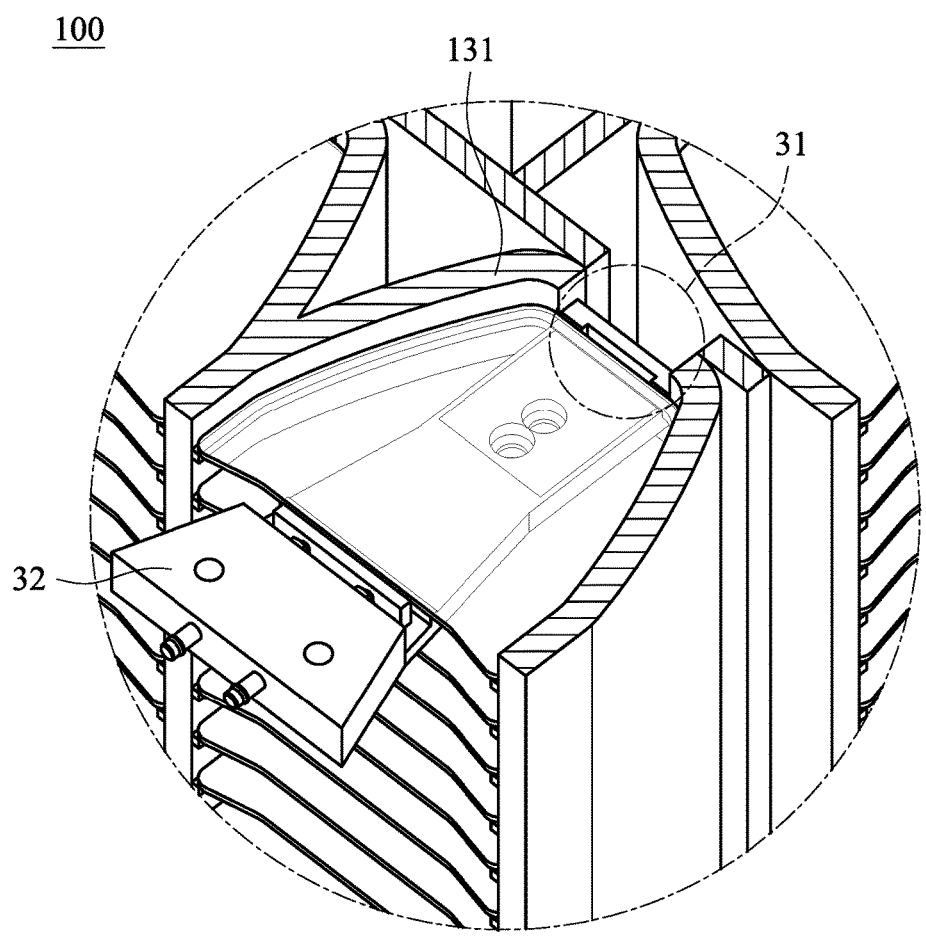
FIG. 3B shows a perspective view of the partial apparatus in FIG. 3A.

FIG. 3A shows a top view illustrating a portion of the apparatus 100 according to one embodiment of the present invention. FIG. 3B shows a perspective view of the partial apparatus 100 in FIG. 3A. According to a further aspect of the embodiment, a distal end 31 of the wafer cassette 13 is unblocked. In other words, the distal end 31 of the wafer cassette 13 has an opening at the distal end 31. The benefit of designing the wafer cassette 13 with an opening at the distal end 31 is that a front end of a robotic hand 32 will not bounce in case that the front end of the robotic hand 32 unexpectedly hits the wall 131 of the wafer cassette 13 due to misalignment.

Although specific embodiments have been illustrated and described, it will be appreciated by those skilled in the art that various modifications may be made without departing from the scope of the present invention, which is intended to be limited solely by the appended claims.

What is claimed is:

1. Apparatus for carrying and shielding wafers, comprising:
   a wafer container comprising a cover and a base, which define a space for accommodating the wafers;
   a plurality of wafer cassettes disposed in the wafer container; and
   an engaging lock that prevents the wafer cassettes from shifting, the engaging lock comprises:
      a dome with elongated strips fixedly disposed in vertical direction on an inner surface of the dome; and
      a bracket having an inner surface fixed on an outer surface of the dome, and having an outer surface fixed on an inner surface of the cover, the elongated strips being in direct contact with a front surface of side walls of the wafer cassettes.

2. The apparatus of claim 1, wherein the engaging lock is not in contact with the wafers.

3. The apparatus of claim 1, wherein each of the elongated strips has one-side or two-side horizontal extensions.

4. The apparatus of claim 1, wherein the cover is made of a transparent material.

5. The apparatus of claim 1, wherein the wafer container complies with Standard Mechanical InterFace (SMIF) standard.

6. The apparatus of claim 1, wherein the wafer container complies with Front Opening Unified Pod (FOUP) standard.

7. The apparatus of claim 1, wherein a distal end of the wafer cassette has an opening such that the distal end of the wafer cassette is unblocked.

* * * * *